(12) United States Patent
Eriksson

(10) Patent No.: US 7,506,997 B1
(45) Date of Patent: Mar. 24, 2009

(54) ILLUMINATION DEVICE FOR SIMULATION NEON LIGHTING

(75) Inventor: Eric O. Eriksson, Glenview, IL (US)

(73) Assignee: iLight Technologies, Inc., Chicago, IL (US)

( * ) Notice: Subject to any disclaimer, the term of this patent is extended or adjusted under 35 U.S.C. 154(b) by 284 days.

(21) Appl. No.: 11/681,281

(22) Filed: Mar. 2, 2007

(51) Int. Cl.
  *F21V 1/06* (2006.01)
  *F21V 7/18* (2006.01)
(52) U.S. Cl. .................... 362/241; 362/235; 362/247; 362/249
(58) Field of Classification Search ................ 362/227, 362/230, 231, 234–238, 240, 241, 244–249, 362/555, 224, 225, 800, 612, 27, 545, 307, 362/310, 341, 347
See application file for complete search history.

(56) References Cited

U.S. PATENT DOCUMENTS

| | | | | |
|---|---|---|---|---|
| 6,361,186 B1 * | 3/2002 | Slayden | ...................... | 362/249 |
| 6,592,238 B2 * | 7/2003 | Cleaver et al. | .............. | 362/249 |
| 6,948,828 B1 * | 9/2005 | Chambers et al. | ........... | 362/219 |
| 6,953,262 B2 * | 10/2005 | Cleaver et al. | .............. | 362/219 |
| 7,008,097 B1 * | 3/2006 | Hulse | ......................... | 362/546 |
| 7,192,161 B1 * | 3/2007 | Cleaver et al. | .............. | 362/260 |

* cited by examiner

*Primary Examiner*—Bao Q Truong
(74) *Attorney, Agent, or Firm*—Stites & Harbison, PLLC; David W. Nagle, Jr.; Robert C. Yang

(57) ABSTRACT

An illumination device generally comprises a plurality of light-emitting diodes (LEDs); a housing for receiving the plurality of LEDs; a light-diffusing member positioned adjacent the housing for receiving light emitted from the LEDs; and a slotted and reflective circuit board for operably connecting the LEDs to a power source and/or control system. The flexible substrate can be manipulated from a first, substantially flat position to a second position by folding the substrate along upper and lower longitudinal axes defined by slots oriented longitudinally and along either side of a central longitudinal axis of the substrate, such that the substrate can be inserted into the housing in an approximate U-shape. By manipulating the substrate from the first position to the second position in this manner, light from the LEDs that is not directly emitted into the light-diffusing member is collected and reflected by the circuit board into the light-diffusing member.

11 Claims, 1 Drawing Sheet

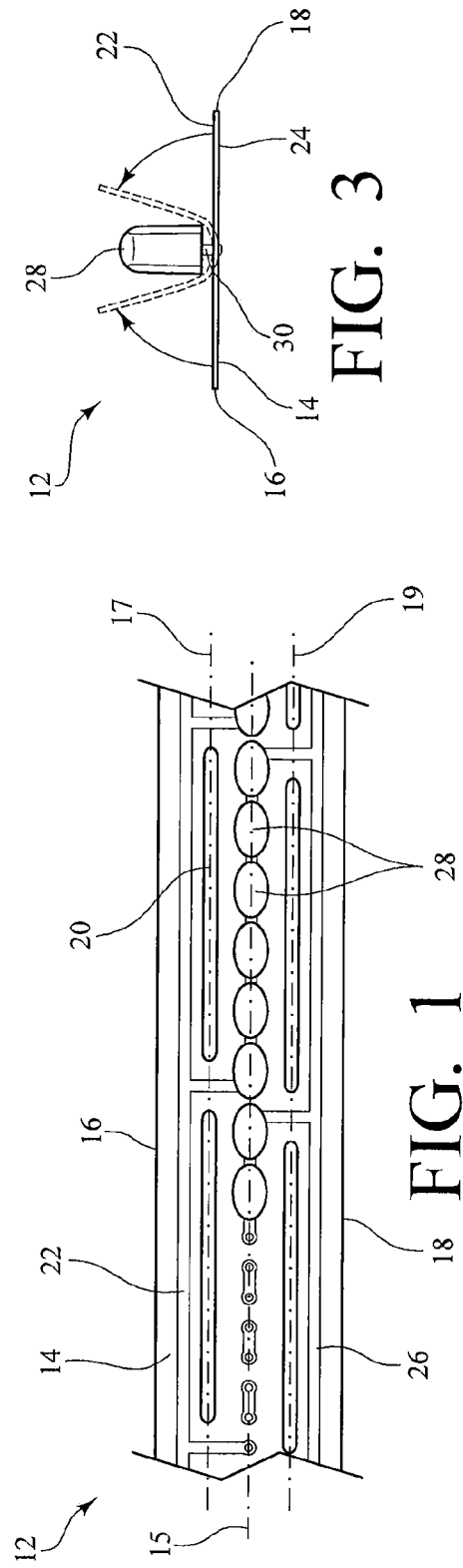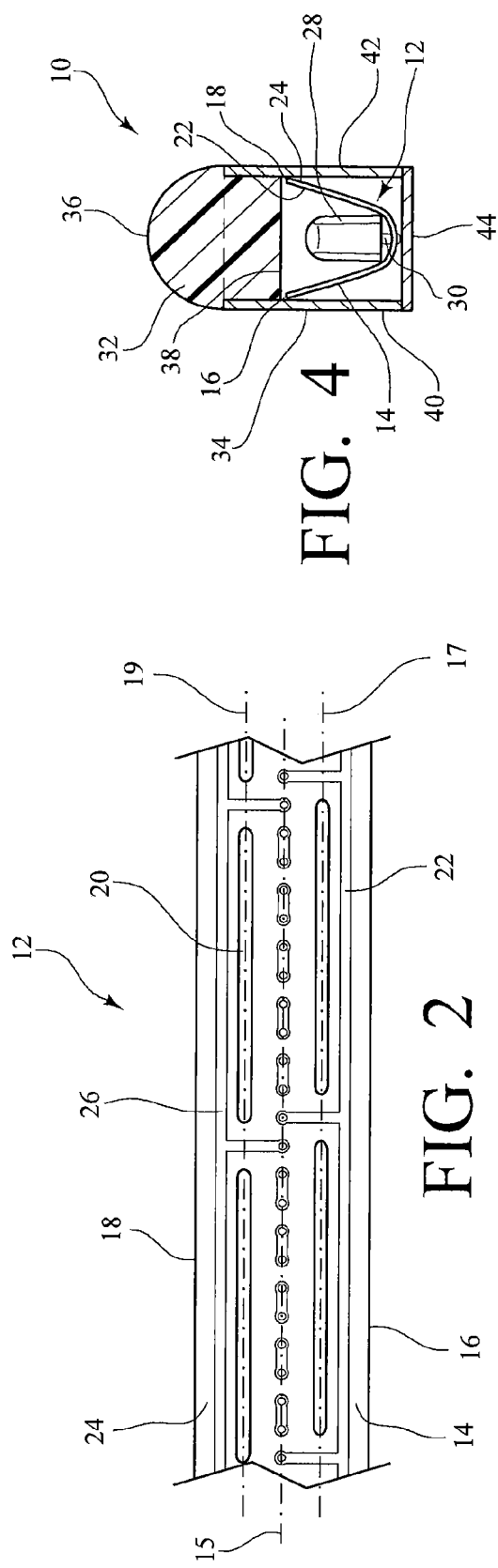

ILLUMINATION DEVICE FOR SIMULATION NEON LIGHTING

BACKGROUND OF THE INVENTION

The present invention relates to an illumination device for simulating neon or similar lighting, and more particularly, to an illumination device incorporating a slotted and reflective circuit board to increase light-collection efficiency.

Neon lighting, which is produced by the electrical stimulation of the electrons in the low-pressure neon gas-filled glass tube, has been a main stay in advertising and for signage. A characteristic of neon lighting is that the tubing encompassing the gas has an even glow over its entire length irrespective of the viewing angle. This characteristic makes neon lighting adaptable for many advertising applications, including script writing and designs, because the glass tubing can be fabricated into curved and twisted configurations simulating script writing and intricate designs. The even glow of neon lighting being typically devoid of hot spots allows for advertising without visual and unsightly distractions. Thus, any illumination device that is developed to duplicate the effects of neon lighting must also have even light distribution over its length and about its circumference. Equally important, such lighting devices must have a brightness that is at least comparable to neon lighting. Further, since neon lighting is a well-established industry, a competitive lighting device must be lightweight and have superior "handleability" characteristics in order to make inroads into the neon lighting market. Neon lighting is also recognized as being fragile in nature. Because of the fragility and heavy weight, primarily due to its supporting infrastructure, neon lighting is expensive to package and ship. Moreover, it is extremely awkward to initially handle, install, and/or replace. Any lighting device that can provide those previously enumerated positive characteristics of neon lighting, while minimizing its size, weight, and handleability shortcomings, will provide for a significant advance in the lighting technology.

The recent introduction of lightweight and breakage resistant point light sources, as exemplified by high-intensity light-emitting diodes (LEDs), have shown great promise to those interested in illumination devices that may simulate neon or similar lighting and have stimulated much effort in that direction. However, the twin attributes of neon lighting, uniformity and brightness, have proven to be difficult obstacles to overcome as such attempts to simulate neon lighting have largely been stymied by the tradeoffs between light distribution to promote the uniformity and brightness.

In an attempt to address some of the shortcomings of neon, commonly assigned U.S. Pat. Nos. 6,592,238 and 6,953,262, which are incorporated in their entirety herein by reference, describe an illumination device comprising a profiled rod of material having waveguide properties that preferentially scatters light entering one surface ("light-receiving surface") so that the resulting light intensity pattern emitted by another surface of the rod ("light-emitting surface") is elongated along the length of the rod. A light source extends along and is positioned adjacent the light-receiving surface and spaced from the light-emitting surface a distance sufficient to create an elongated light intensity pattern with a major axis along the length of the rod and a minor axis that has a width that covers substantially the entire circumferential width of the light-emitting surface. In one preferred arrangement, the light source is a string of point light sources spaced a distance apart sufficient to permit the mapping of the light emitted by each point light source into the rod so as to create elongated and overlapping light intensity patterns along the light-emitting surface and circumferentially about the surface so that the collective light intensity pattern is perceived as being uniform over the entire light-emitting surface.

One of the features of the illumination device described and claimed in U.S. Pat. Nos. 6,592,238 and 6,953,262 is the uniformity and intensity of the light emitted by the illumination device. While it is important that the disadvantages of neon lighting be avoided (for example, weight and fragility), an illumination device would have little commercial or practical value if the proper light uniformity and intensity could not be obtained. This objective is achieved primarily through the use of a "leaky" waveguide rod. A "leaky" waveguide rod is structural member that functions both as an optical waveguide and light-scattering member. As a waveguide, it tends to preferentially direct light entering the waveguide, including the light entering a surface thereof, along the axial direction of the waveguide, while as a light scattering member, it urges the light out of an opposite surface of the waveguide. As a result, what is visually perceived is an elongated light pattern being emitted along the light-emitting surface of the waveguide rod.

As described in U.S. Pat. Nos. 6,592,238 and 6,953,262, a circuit board is typically populated with LEDs and placed in a housing adjacent the light-receiving surface of the "leaky" waveguide rod. The housing generally comprises a pair of side walls defining an open-ended channel that extends substantially the length of the rod. As such, the housing preferably not only functions to house the circuit board populated with the plurality of LEDs, but also to collect light not emitted directly into the light-receiving surface and reflect it into the rod. Thus, the internal surfaces of the side walls and the circuit board may be constructed of or coated with light-reflecting material (e.g., white paint) in order to increase the light-collection efficiency by reflecting the light incident upon the internal surfaces of the housing to the rod. However, constructing or coating the side walls with light-reflecting material can increase manufacturing costs. Accordingly, there remains a need for a construction for an illumination device which achieves the desired light-collection efficiency, but without unduly increasing manufacturing costs.

SUMMARY OF THE INVENTION

The present invention is an illumination device for simulating neon or similar lighting, which incorporates a slotted and reflective circuit board to increase light-collection efficiency.

An illumination device made in accordance with the present invention generally comprises a plurality of light-emitting diodes (LEDs); a housing for receiving the plurality of LEDs; a light-diffusing member positioned adjacent the housing for receiving light emitted from the LEDs; and a slotted and reflective circuit board for operably connecting the LEDs to a power source and/or control system.

The slotted circuit board includes a flexible substrate of a predetermined length, having a top surface and a bottom surface. The substrate also has a first lateral (upper) edge, a second lateral (lower) edge, and defines a central longitudinal axis. The circuit board receives and is populated with the plurality of LEDs substantially along the central longitudinal axis, with each individual LED operably connected to a conductive trace applied to a surface of the circuit board. The flexible substrate further defines a plurality of slots oriented longitudinally and along either side of the central longitudinal axis, with the slots defining an upper longitudinal axis and a lower longitudinal axis. The slots facilitate manipulation of the substrate along the respective upper and lower longitudinal axes.

The substrate can be manipulated from a first, substantially flat position to a second position by folding the substrate along each of the upper and lower longitudinal axes, such that the substrate can be inserted into the housing in an approximate U-shape. By manipulating the substrate from the first position to the second position in this manner, light from the LEDs that is not directly emitted into the light-diffusing member is collected and reflected by the circuit board into the light-diffusing member.

DESCRIPTION OF THE DRAWINGS

FIG. 1 is a partial plan view of a slotted circuit board for incorporation into an illumination device made in accordance with the present invention, and showing the conductive trace applied to the top surface of the substrate of the circuit board FIG. 2 is a partial plan view of the circuit board of FIG. 1, showing the conductive trace applied to the bottom surface of the substrate of the circuit board;

FIG. 3 is an end view of the circuit board of FIG. 1, illustrating the manipulation of the substrate from a first position to a second position; and FIG. 4 is an end view of an exemplary illumination device incorporating the circuit board of FIGS. 1-3.

DETAILED DESCRIPTION OF THE INVENTION

The present invention is an illumination device for simulating neon or similar lighting, which incorporates a slotted and reflective circuit board to increase light-collection efficiency.

An illumination device made in accordance with the present invention generally comprises a plurality of light-emitting diodes (LEDs); a housing for receiving the plurality of LEDs; a light-diffusing member positioned adjacent the housing for receiving light emitted from the LEDs; and a slotted and reflective circuit board for operably connecting the LEDs to a power source and/or control system.

FIGS. 1-2 are partial plan views of the respective top and bottom surfaces of an exemplary slotted circuit board 12 for incorporation into an illumination device 10 made in accordance with the present invention. The slotted circuit board 12 includes a flexible substrate 14 of a predetermined length, having a top surface 22 and a bottom surface 24. The substrate 14 also has a first lateral (upper) edge 16, a second lateral (lower) edge 18, and defines a central longitudinal axis 15. A conductive trace 26 is applied to the substrate 14, in this exemplary embodiment, to the top and bottom surfaces 22, 24, as shown in FIG. 2. The conductive trace 26 would commonly be applied by adhering a layer of copper over the substrate 14, and then removing unwanted copper through chemical etching or a similar technique; however, other manufacturing methods could also be used to apply the conductive trace 26 without departing from the spirit and scope of the present invention.

The flexible substrate 14 further defines a plurality of slots 20 oriented longitudinally and along either side of the central axis 15, with the slots 20 defining an upper longitudinal axis 17 and a lower longitudinal axis 19. In this exemplary embodiment, assuming that the circuit board has a width of approximately 0.75"each slot 20 is approximately 1.00" long and 0.005" wide, and the distance between adjacent slots is approximately 0.25". In any event, the slots 20 facilitate manipulation of the substrate 14 along the respective upper and lower longitudinal axes 17, 19. Preferably, the slots 20 are cut or made simultaneously, with a punch or other mechanical device. Of course, the slots 20 are also cut in such a manner that the slots 20 do not disrupt the electrical connection of the LEDs 28 to the trace 26.

Furthermore, it should be recognized that the slots 20 need not necessarily be elongated to accomplish the objectives of the present invention. Rounded holes, perforations, or similar openings through the substrate 14 could also be used to define the respective upper and lower longitudinal axes 17, 19 and facilitate the manipulation of the substrate 14. Therefore, the term "slot" as used in the present application is intended to include any such alternate openings that facilitate the manipulation of the substrate 14.

Of particular importance to achieve the objectives of the present invention, the top surface 22 of the substrate 14 is reflective. This may be accomplished by constructing the substrate 14 from a light-reflecting material or by coating or otherwise applying a light-reflecting material, such as white paint or tape, to the top surface 22 of the substrate 14.

Referring still to FIGS. 1-2 and the end view of FIG. 3, the top surface 22 of the circuit board 12 receives and is populated with the plurality of LEDs 28. Each individual LED 28 is operably connected to the conductive trace 26 substantially along the central longitudinal axis 15. Specifically, the legs 30 of each LED 28, as shown in FIG. 3, are soldered or similarly connected to the conductive trace 26 substantially along the central axis 15, thus operably connecting the LEDs 28 to a power source and/or control system (not shown). Furthermore, in this exemplary embodiment, it should be recognized that the trace 26 forms a continuous bus along the length of the substrate 14 outside of the area bounded by the respective upper and lower longitudinal axes 17, 19, with the trace 26 traveling between adjacent slots 20 for connection to the LEDs 28.

Referring to FIG. 1, when the substrate 14 is manufactured, it would typically be in a substantially flat orientation, i.e., in a first position. Of course, being in such a substantially flat orientation makes it easy to cut the slots 20 described above through the substrate 14. Referring now to FIG. 3, the substrate 14 can be manipulated from the first position to a second position by folding the substrate 14 along each of the upper and lower longitudinal axes 17,19, such that the substrate is in an approximate U-shape.

Referring now to FIG. 4, manipulating the substrate 14 to the second position in this manner allows the circuit board 12 to be positioned in a housing 34 of the exemplary illumination device 10, which is similar to that described in U.S. Pat. Nos. 6,592,238 and 6,953,262. Specifically, and as shown in FIG. 4, such an exemplary illumination device 10 for simulating neon or similar lighting includes the slotted circuit board 12 populated with the plurality of LEDs 28; the housing 34 for receiving the slotted circuit board 12 and LEDs 28; and a light-diffusing member 32 positioned adjacent the housing 34 for receiving light emitted from the LEDs 28.

In this exemplary embodiment, the light-diffusing member 32 is a rod-like member similar to that described in U.S. Pat. Nos. 6,592,238 and 6,953,262 having a light-emitting surface 36 and an internal surface that serves as a light-receiving surface 38. Although such geometry is desirable because it simulates a neon tube, the light-diffusing member 32 could also be produced in various other shapes without departing from the spirit and scope of the present invention. In any event, light entering the light-diffusing member 32 of the illumination device 10 through the light-receiving surface 38 is scattered and/or diffused so as to be perceived as being substantially uniform over the light-emitting surface 36.

Referring still to FIG. 4, as mentioned above, the slotted circuit board 12 populated with the plurality of LEDs 28 is positioned within the housing 34. The housing 34 generally comprises a pair of side walls 40, 42 and a base 44 defining an open-ended channel that extends substantially the length of the light-diffusing member 32. As mentioned above, in prior art constructions as described in U.S. Pat. Nos. 6,592,238 and 6,953,262, the outer surfaces of the side walls 40, 42 may be constructed of or coated with a light-absorbing material (e.g., black paint or tape) while the inside surfaces of the side walls 40, 42 and the base 44 are coated with a light-reflecting material in order to increase the light-collection efficiency by reflecting the light incident upon the internal surfaces of the housing 34 to the light-diffusing member 32. However, by using the slotted and reflective circuit board 12 described above, it is not necessary to coat the side walls 40, 42 and/or the base 44 with a light-reflecting material. Rather, since the circuit board 12 itself is constructed with or coated with a light-reflecting material, once the substrate 14 has been manipulated into the approximate U-shape of the second position and positioned in the housing 34, the circuit board 12 effectively serves as a quasi-parabolic reflector, such that light from the LEDs 28 that is not directly emitted into the light-diffusing member 32 is collected and reflected by the circuit board 12 into the light-diffusing member 32. Thus, such a construction improves the light-collection efficiency, but without unduly increasing manufacturing costs.

Furthermore, it should be recognized that to the extent that the flexible substrate 14 is resilient and tries to return to its original, flat position, the side walls 40, 42 of the housing 32 restrict such movement and hold the flexible substrate 14 in the approximate U-shape of the second position.

A method of manufacturing an illumination device 10 in accordance with the present invention includes the steps of: providing a circuit board 12, which receives and operably connects a plurality of light-emitting diodes 28 to a power source and/or control system, and includes a flexible substrate 14 defining a plurality of slots 20 oriented longitudinally and along either side of a central longitudinal axis 15; manipulating the substrate 14 of the circuit board 12 from a first, substantially flat position to a second position by folding the substrate along longitudinal axes defined by the slots 20 into an approximate U-shape; positioning the circuit board 12 in the second position into a housing 34; and placing a light-diffusing member 32 adjacent the housing 34 for receiving light emitted directly from the light-emitting diodes 28 and light collected and reflected from the circuit board 12.

One of ordinary skill in the art will also recognize that additional embodiments are possible without departing from the teachings of the present invention or the scope of the claims which follow. This detailed description, and particularly the specific details of the exemplary embodiments disclosed herein, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. An illumination device, comprising:
   a plurality of light-emitting diodes;
   a circuit board receiving and operably connecting said light-emitting diodes;
   a housing for receiving said circuit board and said light-emitting diodes; and
   a light-diffusing member adjacent said housing for receiving light emitted from said light-emitting diodes;
   wherein said circuit board includes
      a flexible substrate of a predetermined length having a light-reflecting top surface and a bottom surface, and defining a central longitudinal axis, said substrate further defining a plurality of slots oriented substantially longitudinally on one side of said central longitudinal axis along an upper longitudinal axis and on another side of said central longitudinal axis along a lower longitudinal axis, and
      a conductive trace applied to a surface of said flexible substrate for receiving and operably connecting said light-emitting diodes substantially along said central longitudinal axis, and
   wherein the flexible substrate of said circuit board is manipulated from a first, substantially flat position to a second position in which said substrate is folded along said upper and lower longitudinal axes into an approximate U-shape, such that when said circuit board is positioned and received in said housing, light from said light-emitting diodes that is not directly emitted into said light-diffusing member is collected and reflected by said circuit board into said light-diffusing member.

2. The illumination device as recited in claim 1, wherein the substrate is constructed from a light-reflecting material.

3. The illumination device as recited in claim 1, wherein the light-reflecting top surface of said substrate is a result of the application of a light-reflecting material to the top surface of said substrate.

4. The illumination device as recited in claim 1, wherein said housing include a pair of side walls.

5. The illumination device as recited in claim 4, wherein said side walls restrict movement of the substrate and hold the substrate in the approximate U-shape of the second position.

6. A method of manufacturing an illumination device, comprising the steps of:
   providing a circuit board, which receives and operably connects a plurality of light-emitting diodes, and includes a flexible substrate defining a plurality of slots oriented longitudinally and along either side of a central longitudinal axis;
   manipulating the substrate of the circuit board from a first, substantially flat position to a second position by folding the substrate along the longitudinal axes defined by the slots into an approximate U-shape;
   positioning the circuit board in the second position into a housing; and
   placing a light-diffusing member adjacent the housing for receiving light emitted directly from the light-emitting diodes and light collected and reflected by the circuit board.

7. The method of manufacturing an illumination device as recited in claim 6, wherein a conductive trace is applied to a surface of said flexible substrate for receiving and operably connecting said light-emitting diodes substantially along said central longitudinal axis.

8. The method of manufacturing an illumination device as recited in claim 6, wherein said substrate is constructed from a light-reflecting material.

9. The method of manufacturing an illumination device as recited in claim 6, wherein light-reflecting material is applied to a top surface of said substrate.

10. The method of manufacturing an illumination device as recited in claim 6, wherein said housing include a pair of side walls.

11. The method of manufacturing an illumination device as recited in claim 10, wherein said side walls restrict movement of the substrate and hold the substrate in the approximate U-shape of the second position.

* * * * *

UNITED STATES PATENT AND TRADEMARK OFFICE
CERTIFICATE OF CORRECTION

PATENT NO. : 7,506,997 B1 Page 1 of 1
APPLICATION NO. : 11/681281
DATED : March 24, 2009
INVENTOR(S) : Eriksson It is certified that error appears in the above-identified patent and that said Letters Patent is hereby corrected as shown below:

In the Title item [54]:

Change title to read: ILLUMINATION DEVICE FOR SIMULATING NEON LIGHTING

Signed and Sealed this

Twenty-eighth Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,506,997 B1 Page 1 of 1
APPLICATION NO. : 11/681281
DATED : March 24, 2009
INVENTOR(S) : Eriksson It is certified that error appears in the above-identified patent and that said Letters Patent is hereby corrected as shown below:

In the Title, Title Page, item [54] and Column 1, lines 1 and 2,

Change title to read: ILLUMINATION DEVICE FOR SIMULATING NEON LIGHTING

This certificate supersedes the Certificate of Correction issued April 28, 2009.

Signed and Sealed this

Nineteenth Day of May, 2009

JOHN DOLL
*Acting Director of the United States Patent and Trademark Office*